United States Patent [19]

Oppelt et al.

[11] Patent Number: 5,144,239
[45] Date of Patent: Sep. 1, 1992

[54] CIRCULARLY POLARIZING RF ANTENNA FOR AN MRI APPARATUS

[75] Inventors: Ralph Oppelt, Weiher; Horst Siebold, Erlangen, both of Fed. Rep. of Germany

[73] Assignee: Siemens Aktiengesellschaft, Munich, Fed. Rep. of Germany

[21] Appl. No.: 565,137

[22] Filed: Aug. 10, 1990

[30] Foreign Application Priority Data

Aug. 16, 1989 [EP] European Pat. Off. ........ 89115110.2

[51] Int. Cl.⁵ ............................................. G01R 33/20
[52] U.S. Cl. .................................................... 324/318
[58] Field of Search ................ 333/219, 237; 343/742, 343/744, 867, 748; 324/322, 318, 309

[56] References Cited

U.S. PATENT DOCUMENTS

| | | | |
|---|---|---|---|
| 2,324,462 | 7/1943 | Leeds et al. | 343/742 |
| 2,787,788 | 5/1957 | Clough | 343/867 |
| 3,832,716 | 8/1974 | Plunk et al. | 333/237 |
| 4,707,664 | 11/1987 | Fehn et al. | 324/322 |
| 4,825,163 | 4/1989 | Yabusaki | 324/322 |
| 4,875,013 | 10/1989 | Murakami et al. | 324/322 |
| 5,045,792 | 9/1991 | Mehdizadeh | 324/318 |
| 5,057,777 | 10/1991 | Kurczewski | 324/318 |

FOREIGN PATENT DOCUMENTS

| | | |
|---|---|---|
| 0142760 | 5/1985 | European Pat. Off. . |
| 0171972 | 2/1986 | European Pat. Off. . |
| 0301232 | 2/1989 | European Pat. Off. . |
| 2448544 | 5/1975 | Fed. Rep. of Germany ...... 333/219 |
| WO8808971 | 11/1988 | France . |
| 6173061 | 9/1984 | Japan ................................. 324/318 |
| 0044802 | 2/1990 | Japan ................................. 333/219 |

OTHER PUBLICATIONS

"Quadrature Detection Coils-A Further √2 Improvement in Sensitivity" Chen et al. J. Mag. Res. vol. 54 (1983) pp. 234–237.

"A Quadrature Probe for Adult Head NMR Imaging" Sank et al. Book of Abstracts Third Annual Meeting, Society of Magnetic Resonance in Medicine (1984) pp. 650–651.

Primary Examiner—Michael J. Tokar
Assistant Examiner—Raymond Y. Mah
Attorney, Agent, or Firm—Hill, Van Santen, Steadman & Simpson

[57] ABSTRACT

A circularly polarizing RF antenna suitable for use in a magnetiic resonance imaging tomography apparatus has four current loops, each formed by two U-shaped conductors with the ends of the lateral legs of the U-shaped conductors disposed opposite to each other in mirror-symmetric fashion, and the ends of the lateral legs being bridged by a resonant capacitor. The current loops are arranged on a carrier which forms a portion of a hollow cylinder, and which is divided in an axial direction between two of the current loops, so that at least one of the current loops is removable without electrical contacts. A divisible RF antenna is thus achieved into which a head or a knee joint can be easily introduced for imaging.

2 Claims, 1 Drawing Sheet

CIRCULARLY POLARIZING RF ANTENNA FOR AN MRI APPARATUS

BACKGROUND OF THE INVENTION

1. Field of the Invention

The present invention is directed to a magnetic resonance imaging tomography apparatus, and in particular to a circularly polarizing RF antenna for such an apparatus.

2. Description of the Prior Art

Magnetic resonance imaging devices are known in the art for producing tomograms of an examination subject based on the principle of nuclear magnetic resonance, as well as for conducting diagnostics of anatomical joints and for portraying blood vessels. As is known, an image is constructed by computational or mensurational analysis of integral proton resonance signals from the three-dimensional spin density, or from the relaxation time distribution, of the examination subject. The examination subject, such as a human body, is introduced into a strong, uniform magnetic field, referred to as the fundamental or basic field, which aligns the nuclear spins in the examination subject. Gradient coils are also present which respectfully generate magnetic fields in three dimensions. A radio-frequency (RF) antenna excites the nuclear spins and transmits the resulting emitted magnetic resonance signal to a receiver. The RF antenna is generally connected to a transmitter and to a receiver via matching capacitances, and via a transmission/reception diplexer.

As is known, circularly polarizing antennas require relatively little transmission power when used in such devices, because they essentially generate only the field components effective for the nuclear magnetic resonance, for example, field components having a left rotational sense. For example, such an antenna may consist of two linearly polarizing antenna systems arranged orthogonally relative to each other, which are connected to a transmitter and to a receiver via a 90° directional coupler. A transmission signal which is fed into the antenna is supplied directly to one of the antenna systems, and is phase shifted by 90° and supplied to the other antenna system. This generates the rotating field which is effective for nuclear magnetic resonance tomography. In the reception mode, the antenna represents two signal sources phase-shifted by 90°, and also represents two uncorrelated noise sources. The 90° directional coupler supplies the in-phase sum of the signals to the receiver. An improvement by at least a factor $\sqrt{2}$ in the signal-to-noise ratio is obtained with such antennas, and only about half of the supplied power is required in comparison to linearly polarizing antennas, because a counter-rotating field component is not generated. This is described in the Journal of Magnetic Resonance, Vol. 54 (1983), at pages 324–327.

For obtaining a magnetic resonance image of the head, an antenna which tightly surrounds the head is generally employed. Circularly polarized head antennas are preferred, because they have an improved signal-to-noise ratio as well as a lower power consumption and better penetration characteristics. in order that the head of the human body can be more easily introduced into such antennas, efforts have been undertaken to make the antenna divisible. Such antennas can be employed for other purposes, for example, for obtaining an image of a movement-restricted, injured knee joint. In a known embodiment of a nuclear magnetic resonance tomography apparatus having a linearly polarizing antenna, the hollow-cylindrical coil system is divisible along a cylinder axis such that a lower, firmly mounted half antenna and an upper, removable half antenna are present. Energy feed ensues only to the lower half; whereas the upper half is inductively coupled to the lower half. In one embodiment, a plug-type connection between the two halves can also be provided, and thus both halves can be connected to a power supply. Such an antenna is described in European Patent Application 0 142 760.

In devising a circularly polarizing RF antenna which is divisible so that one part of the hollow-cylindrical coil system can be removed, or hinged away from, the remainder of the coil system, a problem results in that the conductors carrying the resonant current must be interrupted. In the assembled condition of the radio-frequency antenna, there must be a galvanic connection made via contacts, for example, plug-in contacts, or there must be capacitative connection over relatively large areas. These contacts must carry all of the RF resonant current, and thus have a direct influence on the unloaded quality of the RF antenna, as well as on the stability of its resonant frequency.

A known antenna for a magnetic resonance imaging apparatus for producing tomograms of parts of a human body consists of four H-shaped conductors arranged on a cylindrical surface such that the lateral legs of the conductors form one part of a ring, and the conductors are connected to each other by a stripline proceeding in axial direction of the cylinder. In this circularly polarizing RF antenna, one of the conductor structures is capacitatively coupled to the two neighboring conductor structures, and forms a current loop in combination with these two neighboring conductor structures. For capacitative coupling, a ring of electrically conductive material, for example copper, is provided at both ends of the hollow cylinder. In combination with the legs of the H-shaped conductor structures, these rings respectively form a divided capacitance, which acts as a coupling capacitance, as described in the Book of Abstracts, Society of Magnetic Resonance in Medicine, Third Annual Meeting, Aug. 13–17, 1984, New York).

SUMMARY OF THE INVENTION

It is an object of the present invention to provide a circularly polarizing RF antenna for use in a magnetic resonance imaging apparatus which is easily mechanically divisible for producing tomograms.

The above object is achieved in accordance with the principles of the present invention in a circularly polarizing RF antenna having four conductor structures arranged on a cylindrical surface and respectively forming four current loops. The current loops each consist of two U-shaped conductors, each U-shaped conductor having lateral legs with the ends of the lateral legs of the two U-shaped conductors forming a current loop being disposed opposite to each other in mirror-symmetric fashion, and being bridged by a resonant capacitor. The current loops are arranged on a carrier forming at least a part of a hollow cylinder. The carrier is axially divided between at least two current loops, so that at least one of the current loops is removable without electrical contacts being required. At least one of the current loops is removable or hingeable, but in a further embodiment of the invention preferably two of the current loops are removable or hingeable.

The conductor structures may be formed by thin, electrically conductive layers arranged on a carrier consisting of electrically non-conductive material, for example, Plexiglas ®. In such an embodiment, the conductor structure is preferably mechanically divisible and removable together with the allocated portion of the carrier.

DESCRIPTION OF THE PREFERRED EMBODIMENTS

Figure 1:
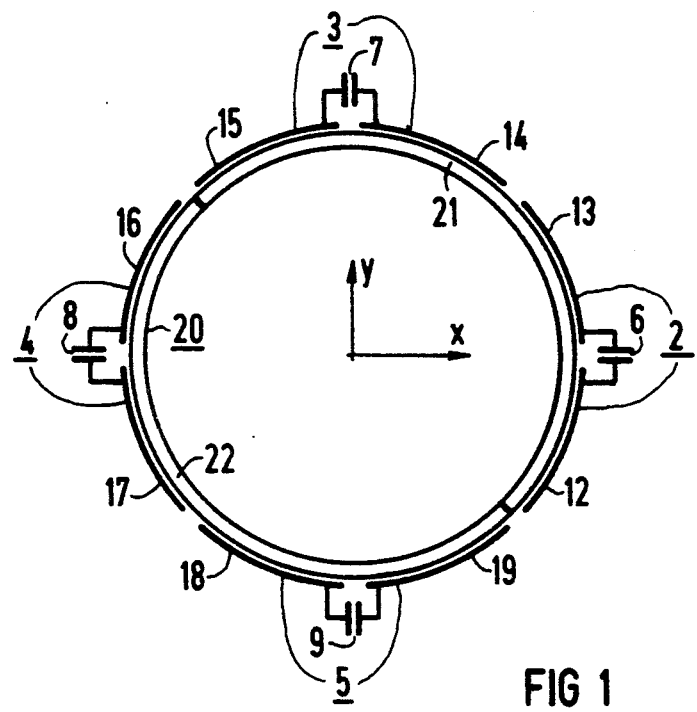
FIG. 1 is a schematic end view of an RF antenna for a magnetic resonance imaging tomography apparatus constructed in accordance with the principles of the present invention.

As shown in FIG. 1, a circularly polarizing RF antenna constructed in accordance with the principles of the present invention and suitable for use in a magnetic resonance imaging tomography apparatus contains four current loops 2 through 5, each of which consists of two conductors, referenced 12 through 19 in the drawings. The lateral legs of each U-shaped conductor 12 through 19 which reside opposite each other are respectively connected to each other via a resonant capacitor, only four of which can be seen in the FIG. 1 and which are referenced 6 through 9. The current loops 2 through 5 consist of band, ribbon or strip-shaped conductors consisting of metal, such as copper. These conductors are preferably applied as a thin coating having a thickness generally not significantly exceeding 100 μm and, preferably having a thickness of approximately 35 μm. These thin coatings are preferably arranged on a hollow-cylindrical carrier, which is divided so that at least one of the current loops 2 through 5 is removable. In the illustrated embodiment, the carrier 20 is divided into parts 21 and 22, such one of these parts, for example, the carrier part 21, is removable with the current loops 2 and 3 thereon. In this embodiment, the other carrier part 22 is rigidly attached to a patient bed (not shown).

Figure 2:
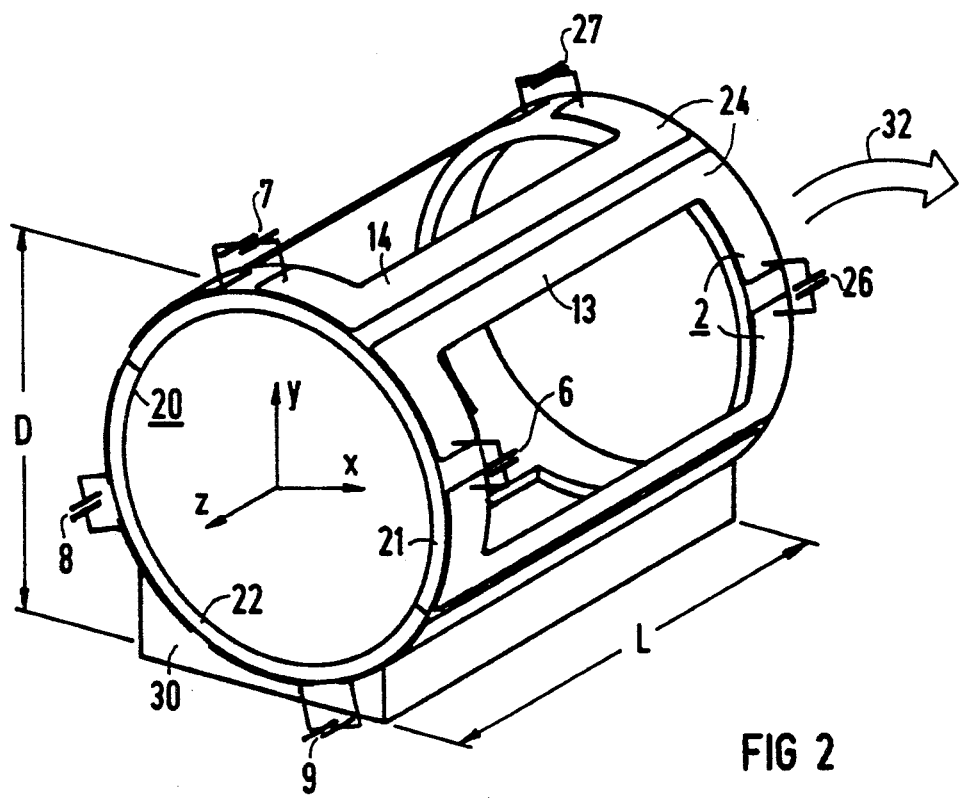
FIG. 2 is a perspective view of the antenna of FIG. 1.

A perspective view of the antenna is shown in FIG. 2 which may serve, for example, as a head antenna. The antenna may have a length L of approximately 280 mm, and a diameter D of approximately 260 mm. As can be seen in FIG. 2, the U-shaped conductors 13 and 14 are disposed so that the middle leg of an H-shaped conductor structure 24 is divided in the axial direction. The middle legs of the U-shaped conductors 13 and 14 can be arranged, for example, on the part 21 of the carrier 20 at a spacing of approximately 2–10 mm, preferably approximately 5 mm.

In addition to the resonant capacitors 6–9 which can be seen in FIG. 1, resonant capacitor 26 associated with the current loop 2 and resonant capacitor 27 associated with the current loop 3 are visible in the FIG. 2. Two other resonant capacitors at the same end of the antenna system as the capacitors 26 and 27 are present for the other current loops, but are not visible in FIG. 2.

In FIG. 2, the stationary arrangement of the carrier part 22 is indicated by a base 30, and the removability of the moveable part 21 is indicated by the arrow 32.

Two neighboring current loops of the current loops 2–5 are fed with a 90° phase shift. The RF feed ensues, for example, via known matching and symmetry networks, at two arbitrary, neighboring resonant capacitors, for example at the resonant capacitors 8 and 9, the feed currents have a 90° difference compared to each other. In this example, therefore, the current loops 4 and 5 are fed, whereas the currents in the loops 2 and 3 are excited via the electromagnetic field due to coupling. The two passively coupled current loops can then be removed without electrical contacts upon the introduction of a patient. Each removable loop corresponds to an aperture angle of 90°. The RF antenna can thus be opened by 180°, without the necessity of electrical contacts at the location of the carrier 20 disposed opposite each other, and can again be closed.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance imaging apparatus for producing tomograms of an examination subject, the improvement of a circularly polarizing RF antenna comprising a carrier consisting of non-electrically conducting material forming at least a portion of a hollow cylinder;

four current loops disposed on said carrier, each current loop consisting of two U-shaped conductors, each U-shaped conductor having lateral legs terminating in respective ends, each of the two U-shaped conductors forming a current loop being disposed so that the respective ends of the lateral legs are opposite each other in mirror symmetric fashion, each of the legs disposed opposite each other being bridged by a resonant capacitor; and said carrier being divided axially between at least two of said current loops so that at least one of said current loops is removable from a remainder of the carrier without electrical contact to any other of said current loops.

2. The improvement of claim 1 wherein said carrier is axially divided in at least two locations disposed opposite each other at a circumference of the carriers so that two of said current loops are removable together with respective portions of said carrier.

* * * * *